US009361179B2

(12) United States Patent
Hammerschmidt et al.

(10) Patent No.: US 9,361,179 B2
(45) Date of Patent: **\*Jun. 7, 2016**

(54) RELIABLE DATA TRANSMISSION WITH REDUCED BIT ERROR RATE

(71) Applicant: Infineon Technologies Austria AG, Villach (AT)

(72) Inventors: Dirk Hammerschmidt, Villach (AT); Timo Dittfeld, Munich (DE); Simon Brewerton, Trowbridge (GB)

(73) Assignee: Infineon Technologies Austria AG, Villach (AT)

( * ) Notice: Subject to any disclaimer, the term of this patent is extended or adjusted under 35 U.S.C. 154(b) by 15 days.

This patent is subject to a terminal disclaimer.

(21) Appl. No.: 14/507,542

(22) Filed: Oct. 6, 2014

(65) Prior Publication Data

US 2015/0026547 A1    Jan. 22, 2015

Related U.S. Application Data

(63) Continuation of application No. 13/040,948, filed on Mar. 4, 2011, now Pat. No. 8,887,022.

(51) Int. Cl.
| | |
|---|---|
| *G06F 11/10* | (2006.01) |
| *H03M 13/09* | (2006.01) |
| *H04L 1/00* | (2006.01) |
| *B60R 21/01* | (2006.01) |

(52) U.S. Cl.
CPC ............ *G06F 11/1004* (2013.01); *B60R 21/01* (2013.01); *H03M 13/093* (2013.01); *H04L 1/0061* (2013.01); *B60R 2021/01286* (2013.01); *H04L 2001/0094* (2013.01)

(58) Field of Classification Search
None
See application file for complete search history.

(56) References Cited

U.S. PATENT DOCUMENTS

| | | | |
|---|---|---|---|
| 5,553,067 A | | 9/1996 | Walker et al. |
| 6,208,924 B1 | * | 3/2001 | Bauer .................... B60R 21/01 |
| | | | 315/77 |
| 6,392,558 B1 | * | 5/2002 | Schulmeyer ......... G05B 19/042 |
| | | | 340/3.1 |

(Continued)

FOREIGN PATENT DOCUMENTS

| | | |
|---|---|---|
| CN | 101803208 A | 8/2010 |
| DE | 10200841339 A1 | 2/2010 |
| WO | 2011006575 A2 | 1/2011 |

OTHER PUBLICATIONS

"Road vehicles-Functional safety-Part 6: Product development: software level," ISO/TC 22/SC 3 BL19, ISO/FDIS 26262-6:2010(E), Dec. 4, 2010, 50 pages.

(Continued)

*Primary Examiner* — M. Mujtaba K Chaudry
(74) *Attorney, Agent, or Firm* — Slater Matsil, LLP

(57) ABSTRACT

A data transmission system includes at least one transmission line. A sender is configured to send data frames to the at least one transmission line and a recipient is configured to receive the data frames from the at least one transmission line. The sender and the recipient are both configured to determine a check sum based on a plurality of corresponding data frames that are sent to and, respectively, received from the at least one transmission line. A check sum comparing unit is configured to receive and to compare the check sum determined by the sender and the corresponding check sum determined by the recipient. The check sum comparing unit is also configured to signal a transmission error or initiate a safety function when the check sums compared are not equal.

25 Claims, 4 Drawing Sheets

(56) References Cited

U.S. PATENT DOCUMENTS

| | | | |
|---|---|---|---|
| 2002/0017776 A1* | 2/2002 | Cox | B60R 21/01564 280/735 |
| 2003/0056043 A1* | 3/2003 | Kostadinov | H04L 12/40032 710/104 |
| 2005/0105556 A1* | 5/2005 | Joung | H04L 69/22 370/469 |
| 2008/0301537 A1 | 12/2008 | Isono | |
| 2010/0199159 A1* | 8/2010 | Isnardi | H03M 13/096 714/807 |
| 2011/0029704 A1 | 2/2011 | Itou et al. | |
| 2012/0191888 A1 | 7/2012 | Schachtner et al. | |
| 2012/0246548 A1 | 9/2012 | Buckley et al. | |

OTHER PUBLICATIONS

"Road vehicles-Functional safety-Part 5: Product development at the hardware level," ISO/TC 22/SC 3 BL19, ISO/FDIS 26262-5:2010(E), Dec. 4, 2010, 82 pages.

* cited by examiner

RELIABLE DATA TRANSMISSION WITH REDUCED BIT ERROR RATE

The present application is a continuation of application Ser. No. 13/040,948 filed on Mar. 4, 2011, which is herein incorporated by reference.

TECHNICAL FIELD

The present invention relates to the field of digital data transmission and, in particular embodiments, to reliable transmission of digital data frames to reduce bit errors in received data frames.

BACKGROUND

There are many known ways for detecting whether a sequence of a certain number of bits (also called "data frame" or simply "frame") includes erroneous bits due to errors during transmission or storage of a data frame. One common way is to include further data bits in the data frame which represent a check sum (also called hash sum). For example, a single parity bit may represent a very simple check sum. However, more sophisticated procedures (so called hash functions) for calculating check sums are known. Another common example for a hash function which may be used for generating check sums is called "cyclic redundancy check" (CRC) or "polynomial code checksum." Dependent on the order of the polynomial which is in such a procedure, it is referred to as CRC4, CRC12, CRC64, etc. (i.e., a CRC using a polynomial of order 4, 12, 64, etc.). For example data transmissions via an Ethernet network or transmissions from and to a hard drive are checked by CRC methods.

Different CRC procedures using polynomials of different lengths (generally different check sum methods) are typically associated with a certain probability that a received bit is incorrect but not detected. One application in which bit errors may have fatal consequences are electronic control units (ECUs) that control the deployment of the airbags installed in an automobile. In such applications the probability of an undetected bit error (bit error probability) and the bit error rate are closely related to the probability of an accidental deployment of an airbag which may have fatal consequences. For this reason the relevant standards such as ISO 26262 (titled "Road vehicles—Functional safety") define so-called "safety integrity levels" (e.g., ASIL A to ASIL D, whereby ASIL is short for "automotive safety integrity level") which are associated with different upper limits for the probability of failures dependent on the risk related to such failure.

In view of the extremely high requirements for the detection of errors in transmitted data frames, particularly in automotive applications, there is a need for improved methods and systems allowing for a reliable data transmission.

SUMMARY OF THE INVENTION

A data transmission system is disclosed. In accordance with one example of the invention the system comprises at least one transmission line, a sender that is configured to send data frames to the at least one transmission line, and a recipient that is configured to receive the data frames from the at least one transmission line. The sender and the recipient are both configured to determine a check sum based on a plurality of corresponding data frames which are sent to and, respectively, received from the at least one transmission line. The data transmission system further comprises a check sum comparing unit that is configured to receive and to compare the check sum determined by the sender and the corresponding check sum determined by the recipient, the check sum comparing unit being further configured to signal a transmission error or initiate a safety function when the check sums compared are not equal.

Further, a bus system is disclosed. In accordance with another example of the invention such system comprises at least one bus line, a sender that is configured to send data frames to the at least one bus line, and a recipient that is configured to receive the data frames from the at least one bus line. The sender and the recipient are both configured to determine a check sum based on a plurality of corresponding data frames which are sent to and, respectively, received from the at least one bus line. The data bus system further comprises a check sum comparing unit that is configured to receive and to compare the check sum determined by the sender and the corresponding check sum determined by the recipient, the check sum comparing unit being further configured to signal a transmission error or to initiate a safety function when the check sums compared are not equal.

Additionally, a method for transmitting data frames from a sender to a recipient over a transmission channel is disclosed. In accordance with a further example of the invention the method comprises determining, on the sender's end, a check sum based on a plurality of data frames which are sent. On the recipient's end, a check sum based on a plurality of corresponding data frames which have been received is determined. The check sum determined by the sender and the corresponding check sum determined by the recipient are compared, and a transmission error is signaled when the check sums compared are not equal.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. In the further description the invention is described using an airbag ECU (electronic control unit) as an example, whereby the ECU communicates with external sensors via an SPI (short for "serial peripheral interface") bus system. However, other applications of the inventive concept exist.

Figure 1:
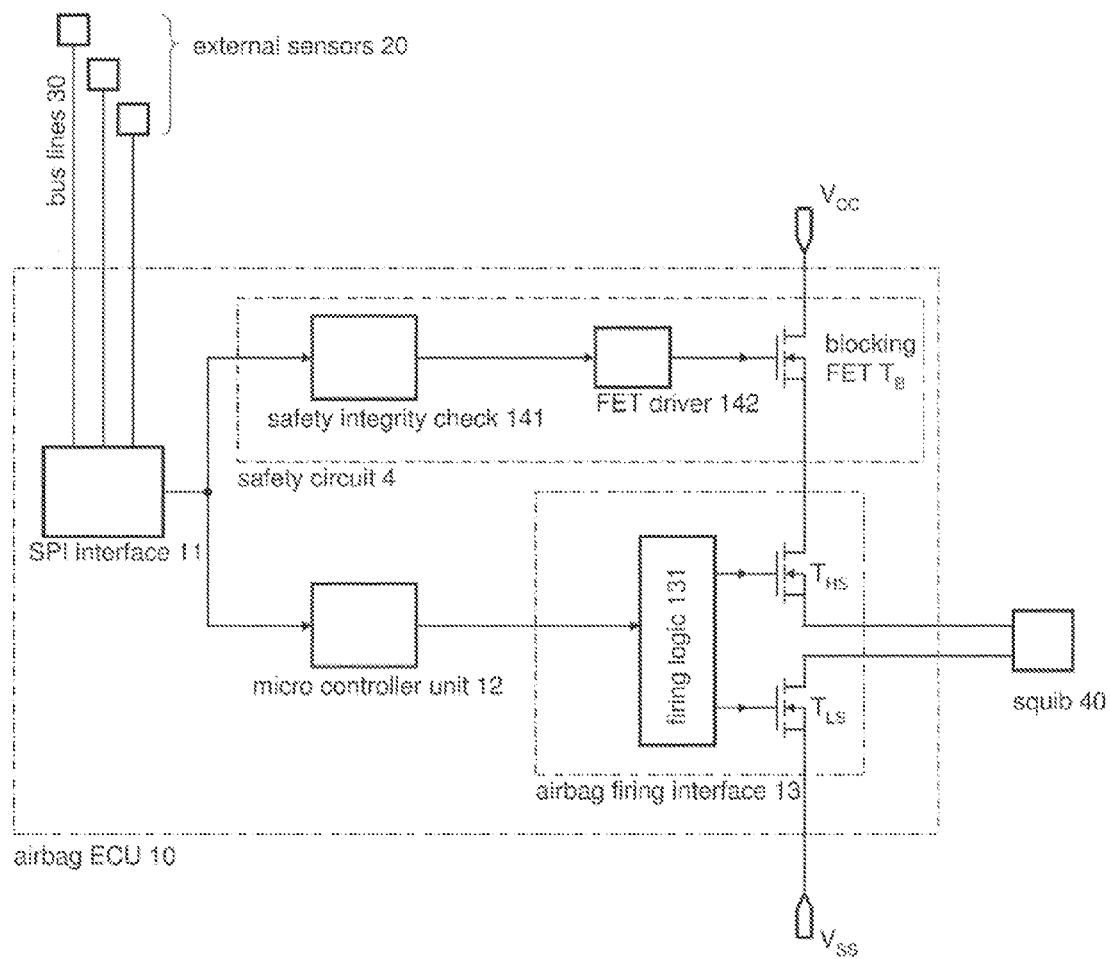
FIG. 1 is a block diagram illustrating the basic components of an ECU that controls the airbag deployment in an automobile.

FIG. 1 is a block diagram illustrating the basic components of an ECU 10 (electronic control unit) that controls the airbag deployment in an automobile. The airbags are deployed ("fired") using so-called squibs. A squib 40 is fired by supplying it with a respective electrical current. A squib usually has two terminals, one being coupled to a low side supply potential $V_{SS}$ via a low side transistor $T_{LS}$ and one being coupled to a high side supply potential $V_{CC}$ (or $V_{DD}$) via a high side transistor $T_{HS}$. If both transistors are driven into an on-state (conducting state of low resistivity) the whole supply voltage $V_{CC}$-$V_{SS}$ is applied to the squib 40. In order to prevent an accidental firing of the squib 40 a blocking transistor $T_B$ is further coupled in series to the squib 40 and the transistors $T_{HS}$, $T_{LS}$ such that a firing of the squib is prevented if the blocking transistor is driven into an off-state (non-conducting state of high resistivity). The blocking transistor $T_B$ is driven into its off-state when inconsistency is detected in received data which is relevant for the deployment of an airbag. The transistors $T_{HS}$ and $T_{LS}$ are driven by a firing logic unit 131 whereby in the present example the transistors $T_{HS}$ and $T_{LS}$ are implemented as MOSFETs and thus the firing logic unit 131 includes appropriate gate drivers for generating the gate signals in accordance with an input signal supplied to the firing logic unit 131. The transistors $T_{HS}$ and $T_{LS}$ and the firing logic unit 131 compose, inter alia, an airbag deployment interface 13. Further, the blocking transistor $T_B$, a respective driver 142, and a corresponding safety integrity check unit 141 compose, inter alia, a safety circuit 4 which is adapted to prevent unwanted deployment of an airbag due to inconsistent or corrupt data which is relevant for airbag deployment.

The mentioned input signal to the airbag firing interface 13 is provided by a microcontroller unit 12 (MCU) which receives data from external sensors 20 via a bus interface unit 11. The bus interface unit 11 communicates with the external sensors 20 via bus lines 30. In the present example the bus interface unit 11 includes, e.g., a PSI5 (short for: Peripheral Sensor Interface 5) interface managing the communication with the external sensors 20 and an SPI interface which is used for communicating the information received from the external sensors 20 to the internal SPI bus of the ECU 10. Thus, the bus interface unit 11 may be seen as bridge unit that allows the sensors 20 to communicate with the MCU 12 via a standard interface such as SPI. The external sensors may employ a different standard to communicate with the bus interface unit 11, such as PSI5 (as illustrated in the example of FIG. 1), DSI (short for: Digital Signal Interface), LIN (short for local Interconnect Network), CAN-bus or the like. Different standards may be used for connecting different types of external sensors 20 to one ECU 10. The above mentioned safety circuit 4 (or parts thereof) may be implemented in the MCU 12 using appropriate software. However, it might be preferable to provide separate and independently operable hardware for the safety circuit 4. For this purpose the safety circuit may be implemented on a separate silicon die.

The external sensors 20 may be provide information relevant for airbag deployment. Such information may cover, inter alia, seat occupancy, acceleration, atmospheric pressure inside the doors, driving direction, velocity, etc. As mentioned, the respective sensors 20 may communicate with the bus interface unit 11 of the ECU 10 via a two-wire sensor interface such as, for example, the Peripheral Sensor Interface 5 (PSI5) which is common in automotive applications for connecting sensors to other electronic circuits such as, for example ECU 10. However, any other communication standard suitable for connecting the external sensors 20 to the ECU 10 may be applicable.

As mentioned above, the SPI interface 11 of the ECU 10 receives data, which may be relevant for airbag deployment, from external sensors 20 (also called "satellite sensors") and forwards the information to the MCU 12 (and, when necessary, also to the safety circuit 4 via the MCU 12) using a standard bus system such as the SPI which is included in many commonly used microcontrollers. In some applications it is desirable to deploy the airbags (e.g., the side airbags) based on information provided solely by the mentioned external sensors 20. In such cases all the data relevant for airbag deployment has to pass the bus lines (e.g., the SPI bus lines) connecting the SPI interface 11 and the MCU 12 of the airbag ECU 10. In such cases the bus communication has to comply with high safety requirements and a sufficient safety margin has to be assured even under worst case conditions such as, for example, environmental conditions leading to maximum signal distortion, wire break, broken solder joints on the circuit board, etc., all of these examples leading to a significantly increased bit error probability. In the present example of an airbag ECU the whole electronic system controlling the airbag deployment has to comply with the requirements of ASIL D (according to ISO 26262) which demands a failure in time (FIT) rate of less than $10^{-8}$ per hour. The bit error rate of data transmissions over the SPI bus has to include an additional safety margin as it is not the only component which contributes to the overall system failure rate and should thus achieve a FIT rate of less than $10^{-10}$ per hour. However, the actual numerical value may be different in different applications.

Assuming the mentioned FIT rate of $10^{-10}$ per hour a corresponding bit error probability may be calculated dependent on the method which is used for providing check sums so as to be able to detect corrupt data frames received from the SPI bus. For example, when using a CRC method with a polynomial of $4^{th}$ order and a Hamming distance of two, the corresponding tolerable bit error probability is $3 \cdot 10^{-10}$. When using a CRC method with a polynomial of $8^{th}$ order and a Hamming distance of four, the corresponding tolerable bit error probability is about $1.5 \cdot 10^{-5}$. These calculations are based on a typical system including two external sensors which deliver data samples each 500 microseconds whereby transmission errors should be detected in 32 bit data frames. The calculation of extremely low bit error probabilities cannot be assured in a real environment. Thus, some improvements of the check sum calculation method are suggested so as to allow for higher bit error probabilities without increasing the respective FIT rate required by ASIL D.

Simply increasing the order (e.g., CRC16 or CRC32) of the polynomial used in the CRC method can contribute to improve the situation. However, a high order CRC would entail an increased data volume transmitted over the bus lines and thus would require a higher bus clock rate which may be undesired in some applications and may have a negative influence on the bit error probability. A transmission over redundant hardware channels would increase the hardware complexity which may also be undesired. Alternatively, a second CRC using a high order polynomial (e.g., CRC 32 or CRC 64) may be applied to a group of subsequent data frames (e.g., a group of 20 frames of 32 bits) whereby each single data frame is protected by a low order CRC (e.g., CRC4 or CRC8). Such second CRC significantly alleviates the requirements to the bit error probability.

The additional CRC check sum is not transmitted over the bus lines together with every data frame. The check sum is rather updated each time a new data frame is transmitted and this check sum will depend on (and thus represent) all data frames transmitted after a reset of the check sum. The current value of the check sum may be requested by a designated bus command (an SPI command in the present example). The bus master may request the "cumulative" CRC check sum at least once after a defined number of frames have been received from the bus slave. Further the cumulative check sum may be requested if the sensor data received from the bus includes information that would lead to a deployment of the airbag(s).

The additional check sum mentioned above is calculated on the sender's end of the bus line (i.e., in the SPI interface 11 in the example of FIG. 1) based on the transmitted data frames. This sender check sum is transmitted to the recipient (i.e., the bus master which is the MCU 12 in the present example of FIG. 1) on request and compared to a recipient check sum which is calculated by the recipient (the bus master) based on the received data frames. If the received data frames are equal to the transmitted data frames the CRC check sums calculated by sender and recipient are equal. If an error occurs during transmission at least one received data frame differs from the corresponding transmitted data frame and the respective CRC check sums (i.e., the recipient and the sender check sum) will differ. If a comparison of the recipient and the sender check sum yields that the check sums differ, the received data can be qualified as corrupt.

Figure 2:
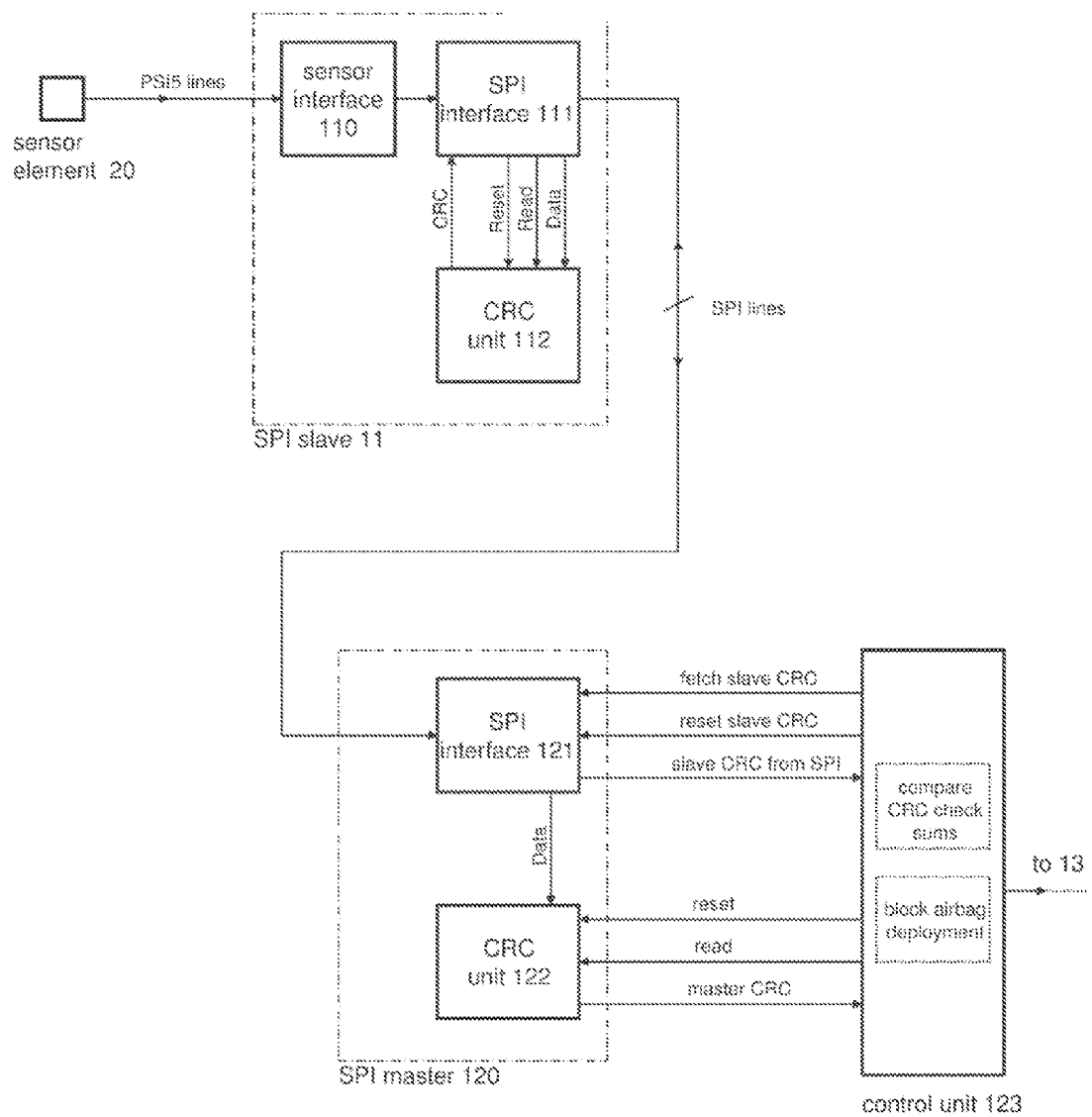
FIG. 2 is a block diagram illustrating one example of bus interfaces connecting an ECU to external sensors and operating in accordance with a first example of the invention.
Figure 3:
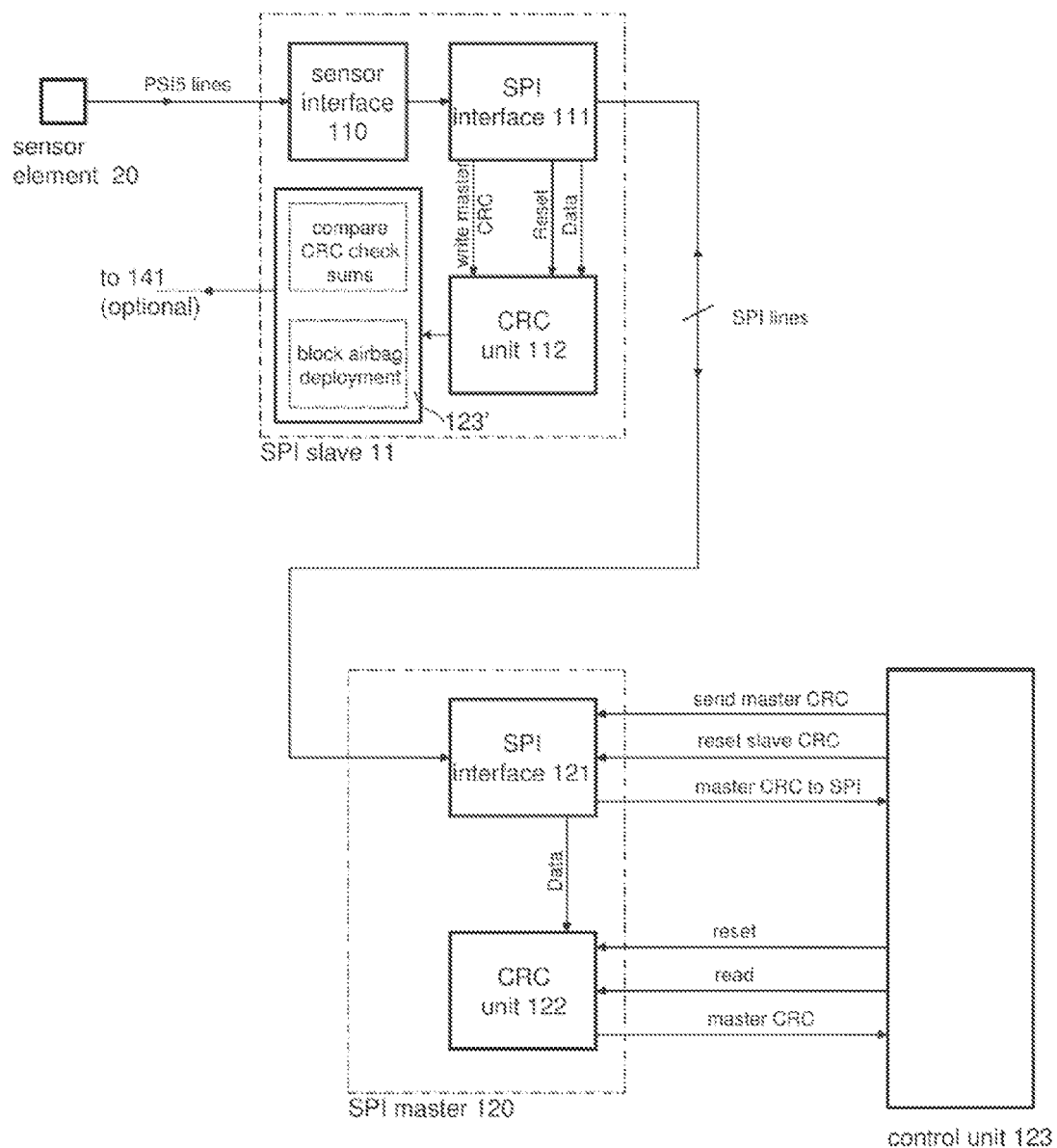
FIG. 3 is a block diagram illustrating another example of bus interfaces connecting an ECU to external sensors and operating in accordance with a second example of the invention.

FIGS. 2 to 3 illustrate some exemplary implementations of the concept introduced above. FIG. 2 is a block diagram illustrating a first exemplary implementation of the novel concept. However, FIG. 2 does not include the complete airbag ECU 10 but only the components relevant for the further discussion. Accordingly, FIG. 2 includes, besides one external sensor 20, an SPI slave unit 11 (corresponding to the SPI interface 11 of FIG. 1) which provides the function of receiving data from the external sensor 20, converting it into data frames compliant with the bus protocol (i.e, the SPI standard in the examples herein), and transmitting it over the bus lines to an SPI master unit 120 which may be implemented in the MCU 12 (see FIG. 1). The SPI slave unit 11 may include a sensor interface 110 that is configured to receive measured data from external sensor(s) 20 and to convert the information obtained therefrom into data frames (data words of defined length, e.g., 32 bits). Each data frame may include a short check sum, for example a fourth order CRC check sum (CRC4). The data frames provided by the sensor interface 110 are handed on to the SPI interface 111 which is responsible for the bus communication in accordance with the bus protocol. In case of an SPI bus system four signals are involved in the bus communication. These signals are denoted as MISO (master input, slave output), MOSI (master output, slave input), SCLK (serial clock signal generated by the bus master), and SS (slave select signal). As the SPI bus system is sufficiently known in the art the details are not further discussed herein. In the present example, the SPI slave 11 sends data to the SPI master 120 using the bus line carrying the MISO signal.

A CRC unit 112 is coupled to the SPI interface 111. The CRC unit 112 receives (see arrow labeled "Data") each data frame that is transmitted (or that is going to be transmitted) and configured to calculate an additional cumulative check sum as already explained above. An updated CRC check sum is calculated each time a data frame is transmitted, whereby the current check sum depends on all previous data frames transmitted after a reset (see arrow labeled "Reset"). In a similar way, the same CRC check sum may be calculated on the SPI master's end using a corresponding CRC unit 122 coupled to the bus master's SPI interface 121. The CRC unit 122 receives (see arrow labeled "Data") each data frame that is received by the SPI interface 121. Further, the CRC unit 122 is also configured to calculate the additional cumulative check sum in the same way as the corresponding CRC unit 112 does on the bus slave's side. That is, an updated CRC check sum is calculated each time a data frame is received, whereby the current check sum depends on all previously received data frames starting from the latest reset (see arrow labeled "Reset").

A CRC control unit 123 is coupled to the SPI master unit 120. As mentioned above, the CRC control unit 123 may be implemented in the MCU 12 using appropriate software. The CRC control unit 123 triggers the reset of the bus master's CRC unit 122 and the bus slave's CRC unit 112 (a respective reset command being sent over the bus lines in the latter case). The control unit 123 may further issue a fetch command over the bus so as to cause the bus slave's CRC unit 112 to send the current cumulative CRC check sum to the bus master 120 and eventually to the control unit 123 (see arrows labeled "fetch slave CRC" and "slave CRC from SPI"). The control unit 123 also has access to the CRC check sum (see arrows labeled "read" and "master CRC") calculated on the bus master's side by CRC unit 122 and can therefore compare the check sums as already discussed above. If the check sums are identical the data is consistent; if not the data can be regarded as corrupt and, as a consequence, a safety function may be triggered. Such safety function may be, in the present example, the deactivation of the airbag firing interface 13 (see FIG. 1) thereby preventing an erroneous airbag deployment.

FIG. 3 is a block diagram illustrating an alternative to the implementation of FIG. 2. The example of FIG. 3 operates similarly to the previous example except that the master's and the slave's CRC check sum are compared at the slave's end of the SPI bus rather than at the master's end. In this case, the CRC control unit 123 is "distributed" across master and slave, i.e., a part 123' of the control unit is implemented at the slave's end of the SPI bus. In the present example, the control unit 123 receives the CRC check sum calculated by the master CRC unit 122 and sends it to the CRC unit 112 on the slave's end via the SPI interface 111 (see arrow labeled "write master CRC"). The control unit 123' (located at the slave's end of the bus) receives both CRC check sums from the slave CRC unit 112 as well as from the master CRC unit 122 (via the SPI bus lines) and compares the two check sums. In case that differences between the two corresponding check sums are detected, safety functions might by triggered directly by the control unit 123' (via the security integrity check unit 141, see FIG. 1) or, alternatively an error message may be sent via the SPI bus to the CRC control unit 123 on the bus master's end. As mentioned above, one safety function may be to prevent an erroneous airbag deployment (either via the safety circuit 4 or by deactivation of the airbag firing interface 13). The CRC check sum calculated on the master's end may be pushed to the control unit 123' at the slave's end at defined intervals (e.g., in response to the $20^{th}$ received data frame after a reset).

Figure 4:
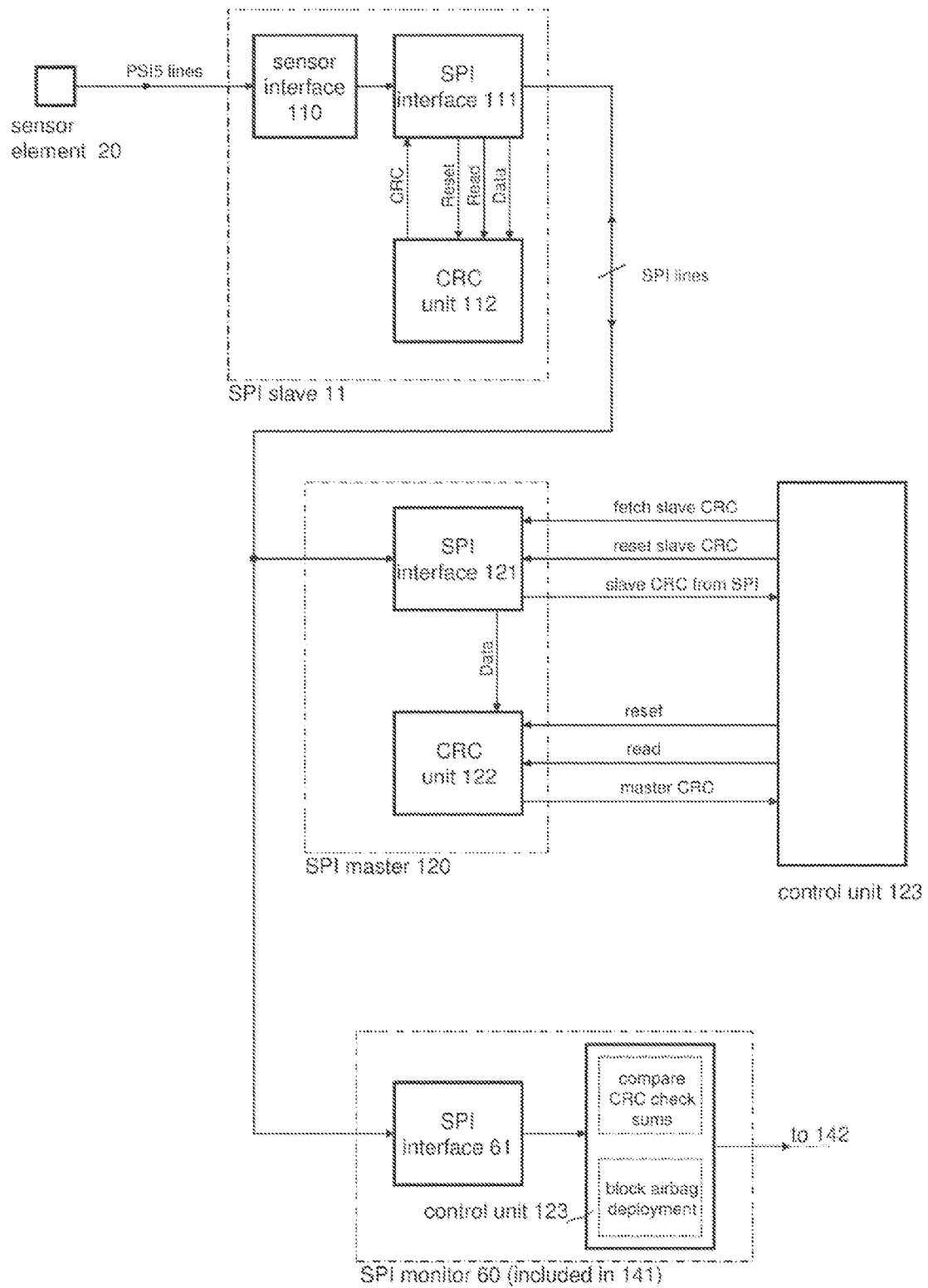
FIG. 4 is a block diagram illustrating a further example of bus interfaces which operate in accordance with a third example of the invention.

In the example of FIG. 4, the comparison of the CRC check sums provided by the SPI master 120 and the SPI slave 11 is provided by a separate SPI monitor unit 60 which may act as a second SPI slave and which may be included in the safety integrity check unit 141 (see FIG. 1). The SPI monitor 60 includes an SPI receiver interface 61 configured to receive messages over the bus from at least the bus master 120. As in the example of FIG. 2, the master requests the slave to send its current cumulative CRC check sum calculated on the bases of the data frames sent. The master sends both check sums to the SPI monitor 60 where the check sums are compared as mentioned above. The SPI interface 61 is typically configured to monitor all the data communication on the SPI bus and thus would receive all messages sent by the SPI slave 11 and SPI master 120. Dependent on the result of the comparison some error messages or security functions may be triggered. Such security function may be blocking an airbag deployment.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those where not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A system comprising:
a recipient configured to receive data frames from at least one transmission line, wherein the recipient is configured to determine a recipient check sum based on a plurality of corresponding data frames that are received from the at least one transmission line;
a check sum comparing unit configured to receive and to compare the recipient check sum with a corresponding sender check sum determined by a sender transmitting the data frames received at the recipient and;
a switch coupled to an output of the recipient and coupled to be activated upon receipt of a signal; and
a safety circuit coupled to the check sum comparing unit, wherein the safety circuit is configured to transmit a deactivation signal configured to prevent the switch from conducting a ON current if the check sums compared are not equal.

2. The system of claim 1, wherein the safety circuit is configured to transmit the deactivation signal at the same time the recipient sends the signal for activating the switch.

3. The system of claim 1, wherein the check sum comparing unit is included in the sender, the recipient, or in a transmission line monitoring unit arranged separately from the sender and the recipient.

4. The system of claim 1, further comprising:
a SPI master unit comprising the recipient, wherein the switch is configured to be coupled to a squib upon activation, and wherein the SPI master unit, the switch, and the safety circuit are part of an electronic control unit system for air bag deployment.

5. The system of claim 1, wherein the recipient comprises a recipient check sum calculation unit configured to calculate the recipient check sum based on the data frames received from the at least one transmission line, wherein the calculated recipient check sum is continuously updated each time a data frame is received, and wherein the calculated recipient check sum depends on all data frames that have been received after a reset of the recipient check sum calculation unit, and
wherein the check sum comparing unit is further configured to signal a transmission error or initiate a safety function when a sender check sum determined by the sender is not equal to the recipient check sum.

6. The system of claim 1, wherein the sender check sum is a polynomial code check sum generated by a cyclic redundancy check (CRC).

7. The system of claim 6, wherein each individual data frame includes a further check sum depending only on information included in the respective data frame.

8. The system of claim 7, wherein the further check sum is a polynomial code check sum generated by a cyclic redundancy check, wherein the order of the further check sum is lower than the order of the check sums which are based on a plurality of corresponding data frames.

9. A system comprising:
a sender configured to send data frames on at least one transmission line to a recipient, wherein the sender is configured to determine a sender check sum based on a plurality of corresponding data frames that are sent from the at least one transmission line;
a check sum comparing unit configured to receive and to compare the sender check sum and a corresponding recipient check sum determined by the recipient;
a switch coupled to an output of the recipient and coupled to be activated upon receipt of a signal; and
a safety circuit coupled to the check sum comparing unit, wherein the safety circuit is configured to transmit a deactivation signal configured to prevent the switch from conducting a ON current if the check sums compared are not equal.

10. The system of claim 9, wherein the sender is configured to send the determined check sum only when the sender receives the signal for activating the switch to be transmitted to the receiver.

11. The system of claim 9, wherein the check sum comparing unit is included in the sender, the recipient, or in a transmission line monitoring unit arranged separately from the sender and the recipient.

12. The system of claim 9, further comprising:
a serial peripheral interface (SPI) slave unit comprising the sender, wherein the SPI slave unit is configured to be coupled to a plurality of external sensors, wherein the SPI slave unit, the switch, and the safety circuit are part of an electronic control unit system for air bag deployment.

13. The system of claim 9,
wherein the sender comprises a sender check sum calculation unit configured to calculate the sender check sum based on the data frames sent to the at least one transmission line, wherein the calculated sender check sum is continuously updated each time a data frame is sent to the at least one transmission line, and wherein the calculated sender check sum depends on all data frames that have been sent to the at least one transmission line after a reset of the sender check sum calculation unit,
wherein the check sum comparing unit is further configured to signal a transmission error or initiate a safety function when the sender check sum is not equal to the recipient check sum.

14. The system of claim 9, wherein the sender check sum is a polynomial code check sum generated by a cyclic redundancy check (CRC).

15. The system of claim 14, wherein each individual data frame includes a further check sum depending only on information included in the respective data frame.

16. The system of claim 15, wherein the further check sum is a polynomial code check sum generated by a cyclic redundancy check, wherein the order of the further check sum is lower than the order of the check sums which are based on a plurality of corresponding data frames.

17. A method for transmitting data frames from a sender to a recipient over a transmission channel, the method comprising:

providing a sender check sum based on a plurality of data frames sent over the transmission channel to the recipient;

providing a recipient check sum based on a plurality of data frames received at the recipient;

comparing the sender check sum with the corresponding recipient check sum; and transmitting a deactivation signal configured to prevent a switch, coupled to an output of the recipient and configured to be activated upon receipt of a signal, from conducting a ON current if the sender check sum is not equal to the recipient check sum.

18. The method of claim 17, further comprising enabling the activation of the switch upon receipt of the signal if the sender check sum is equal to the recipient check sum.

19. The method of claim 17, further comprising receiving a signal indicating the firing of external sensors, and if the sender check sum is equal to the recipient check sum, activating the switch configured to activate a squib.

20. The method of claim 17, further comprising resetting the check sum determination, wherein the recipient check sums depend on all data frames which have been received after a reset.

21. The method of claim 17, further comprising resetting the sender check sum determination, wherein the sender check sums depend on all data frames which have been sent after a reset.

22. The method of claim 17, wherein providing the sender check sum comprises receiving the sender check sum at the recipient.

23. The method of claim 17, wherein providing the sender check sum comprises calculating the sender check sum based on the data frames sent through the transmission channel, wherein the calculated sender check sum is continuously updated each time a data frame is sent, and wherein the calculated sender check sum depends on all data frames that have been sent after a reset of a sender check sum calculation unit configured to calculate the sender check sum.

24. The method of claim 17, wherein providing the recipient check sum comprises receiving the recipient check sum at the sender.

25. The method of claim 17, wherein providing the recipient check sum comprises calculating the recipient check sum based on the data frames received from the transmission channel, wherein the calculated recipient check sum is continuously updated each time a data frame is received, and wherein the calculated recipient check sum depends on all data frames that have been received after a reset of a recipient check sum calculation unit configured to calculate the recipient check sum.

* * * * *